United States Patent
Chang et al.

(10) Patent No.: US 10,541,689 B1
(45) Date of Patent: Jan. 21, 2020

(54) CLOCK GENERATION CIRCUIT AND ASSOCIATED CIRCUITRY

(71) Applicant: M31 TECHNOLOGY CORPORATION, Hsinchu County (TW)

(72) Inventors: Yu Hsiang Chang, New Taipei (TW); Ching-Hsiang Chang, Taipei (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/028,845

(22) Filed: Jul. 6, 2018

(51) Int. Cl.
*H03L 7/07* (2006.01)
*H03L 7/099* (2006.01)

(52) U.S. Cl.
CPC ............... *H03L 7/07* (2013.01); *H03L 7/099* (2013.01)

(58) Field of Classification Search
CPC .................................. H03L 7/07; H03L 7/099
See application file for complete search history.

(56) References Cited

U.S. PATENT DOCUMENTS

| | | | |
|---|---|---|---|
| 7,079,616 B2 | 7/2006 | Castiglione et al. | |
| 7,088,155 B2 * | 8/2006 | Takahashi | H03L 7/07 327/144 |
| 7,692,500 B1 * | 4/2010 | Koukab | H03C 3/0958 331/1 A |
| 7,893,736 B2 | 2/2011 | Palmer et al. | |
| 9,007,105 B2 | 4/2015 | Jenkins | |
| 9,036,764 B1 | 5/2015 | Hossain et al. | |
| 9,503,103 B2 | 11/2016 | Chou | |
| 2009/0184773 A1 | 7/2009 | Woo et al. | |

OTHER PUBLICATIONS

Taiwan counterpart office action dated Feb. 23, 2019 for Taiwan application 107136096.

\* cited by examiner

*Primary Examiner* — Daniel C Puentes
(74) *Attorney, Agent, or Firm* — WPAT, P.C., Intellectual Property Attorneys; Anthony King (57) ABSTRACT

A clock generation circuit arranged in a first system is disclosed. The clock generation circuit includes: a first dual-mode PLL, arranged for generating a first output clock in an integer-N mode or a fractional-N mode selectively, the first output clock being generated based on a first reference clock; and a second dual-mode PLL, arranged for generating a second output clock in an integer-N mode or a fractional-N mode selectively, the second output clock being generated based on the first output clock or a second reference clock selectively. Associated circuitries are also disclosed.

16 Claims, 8 Drawing Sheets

CLOCK GENERATION CIRCUIT AND ASSOCIATED CIRCUITRY

BACKGROUND

Various communications protocols that support high-speed links use a PLL as a frequency synthesizer and also as a noise filter. For example, the PCI Express (Peripheral Component Interconnect Express) standard, officially abbreviated as PCIe or PCI-e, defines specifications for PLLs implemented in transmitter and receiver bus agents for such communications. A typical PLL includes a phase-frequency detector and a closed loop feedback divider.

Certain known PLL implementations include adjustment circuits to tune parameters of the PLL. However, when process, voltage, and temperature variations are taken into account, the adjustment circuits generally have difficulty meeting the stricter PLL specifications. As an example of one such specification, many communication standards allow increasingly small amounts of jitter to propagate from the reference clock signal to the PLL output clock signal.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" can mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1:
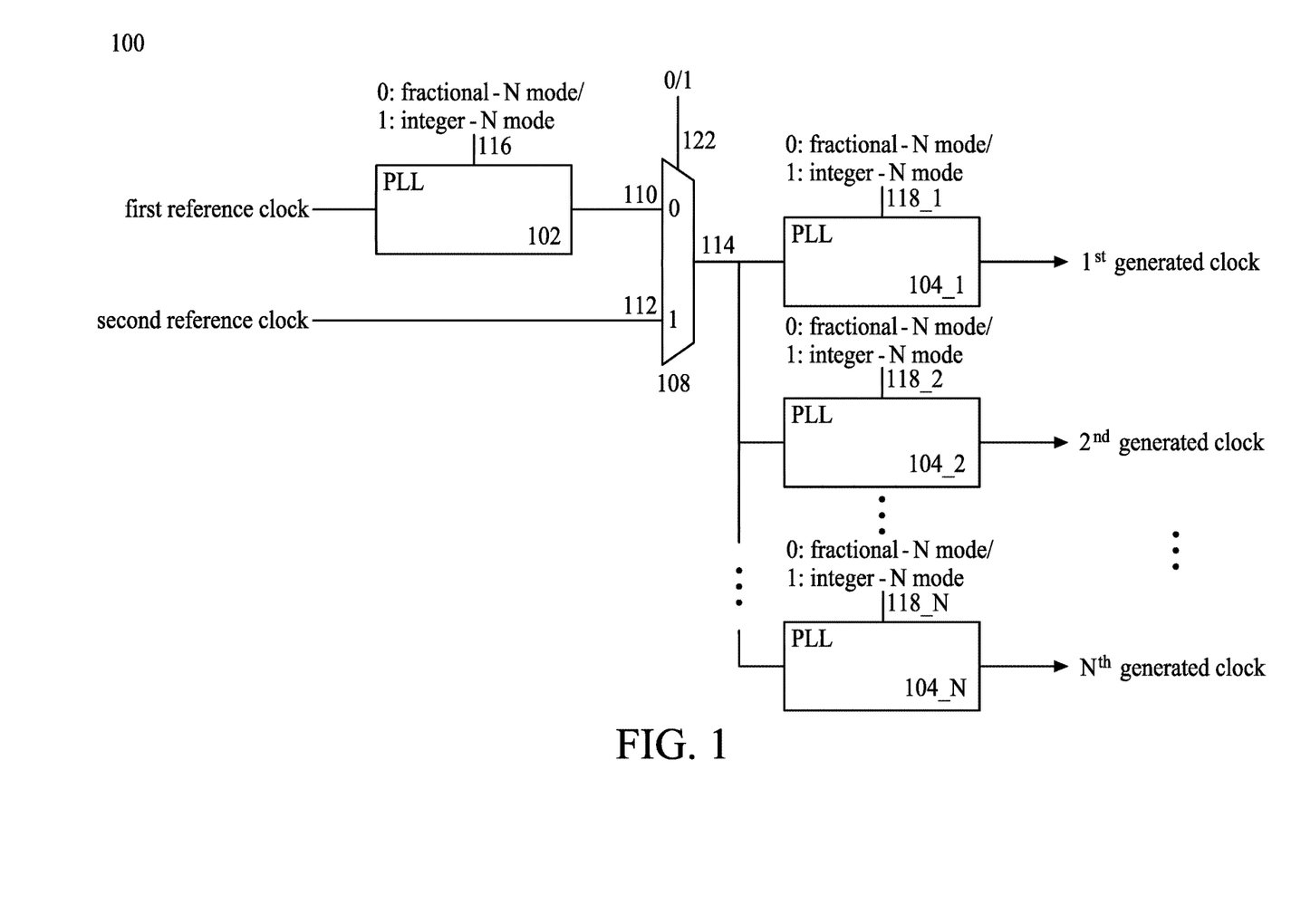
FIG. 1 is a block diagram illustrating a clock generation circuit according to some embodiments of the present disclosure.

FIG. 1 is a block diagram illustrating a clock generation circuit 100 according to some embodiments of the present disclosure. The clock generation circuit 100 provides N generated clocks (i.e., $1^{st}$ generated clock, $2^{nd}$ generated clock, . . . , and $N^{th}$ generated clock) based on a first reference clock or a second reference clock, where N in the present disclosure is a positive integer value. To elaborate, the clock generation circuit 100 includes dual-mode PLLs (phase-locked loop) 102, 104_1, 104_2, . . . , and 104_N all possessing the ability to operate in either of two different clock/frequency division modes, i.e., the integer-N mode and fractional-N mode. As a non-limiting example, frequency of each clock signal output from the PLLs 102, 104_1, 104_2, . . . , and 104_N is greater than frequency of each clock signal input to the PLLs 102, 104_1, 104_2, . . . , and 104_N respectively. As a consequence of the above, the frequency of each of the N generated clocks is greater than the frequency of each of the first reference clock and the second reference clock.

Further still, a combinational logic circuit 108 is also provided to switch one of two input lines 110 and 112 originating from the first and second reference clocks, respectively, to a single common output line 114 by the application of control logics. As a non-limiting example, the combinational logic circuit 108 is a 2-to-1 multiplexer. When a voltage level of an input control line 122 of the combinational logic circuit 108 is raised to a high level (for example, the logical value "1"), the second reference clock is provided to the common output line 114 due to the input line 112 being switched to the common output line 114. By contrast, the clock signal output from the PLL 102 is provided to the common output line 114 when the voltage level of the input control line 122 of the combinational logic circuit 108 is reduced to a low level (for example, the logical value "0") lower than the high level.

The aforementioned first and second reference clocks may be provided by a clock source at a local side where the clock generation circuit 100 is located, or may be generated from a remote side distinct from the local terminal. According to an exemplary embodiment of the present disclosure, the first reference clock is generated at the local side, and the second reference clock is generated at the remote side and transmitted to the local side through a communication channel. Depending on the communication standard to which the clock generation circuit 100 is subject, the communication channel may be either a cable (twisted-pair wire, cable and fiber-optic cable) or a broadcast (microwave, satellite, radio, and infrared) medium. In some embodiments, cable or wire line media mentioned herein use physical wires of cables to transmit data and information.

As a non-limiting example, the first reference clock is generated at the local side by an electronic oscillator circuit that uses the mechanical resonance of a vibrating crystal of piezoelectric material to create an electrical signal with a precise frequency. To elaborate, the most common type of piezoelectric resonator used is the quartz crystal (hence the oscillator circuits incorporating them are known as crystal oscillators), but other piezoelectric materials including polycrystalline ceramics may be used in similar circuits as well. As a non-limiting example, the second reference clock is generated at the remote side by another clock generation scheme, that is, the second reference clock originates from another electronic oscillator circuit at the remote side, which is distinct from the electronic oscillator circuit at the local side. As a non-limiting example, a frequency of the second reference clock is greater than a frequency of the first reference clock; and a jitter of the second reference clock is lower than a jitter of the first reference clock. According to an exemplary embodiment of the present disclosure, the clock generation scheme for generating the second reference clock is independent from the clock generation circuit 100.

Further still, input control lines 116, 118_1, 118_2, . . . , and 118_N are used for selecting or switching a configuration mode of the PLLs 102, 104_1, 104_2, . . . , and 104_N respectively between the integer-N mode and the fractional-N mode. As a non-limiting example, when the PLL 102, 104_1, 104_2, . . . , or 104_N is configured to operate in the integer-N mode by raising a voltage level of the corresponding input control lines 116, 118_1, 118_2, . . . , and 118_N to the high level (for example, the logical value "1"), the PLL 102, 104_1, 104_2, . . . , or 104_N operating in the integer-N mode can be regarded as an integer-N PLL. To elaborate, the integer-N PLL is a frequency multiplier which generates an output signal whose output frequency is an integer multiple of the frequency of its input signal.

By contrast, when the PLL 102, 104_1, 104_2, . . . , or 104_N is configured to operate in the fractional-N mode by reducing the voltage level of the corresponding input control lines 116, 118_1, 118_2, . . . , and 118_N to the low level (for example, the logical value "0"), the PLL 102, 104_1, 104_2, . . . , or 104_N operating in the fractional- N mode can be regarded as a fractional-N PLL. The fractional-N PLL is a frequency multiplier that generates an output signal whose substantial frequency multiple is an integer number plus an arbitrary fractional number. In a fractional-N PLL, the dividing ratio of a frequency divider therein changes dynamically in the lock condition, so as to provide an average conversion factor equal to a fractional number. This structure allows finer resolution of the output frequency; moreover, the fractional-N PLL exhibits improved performance in terms of both settling time and phase noise. As a non-limiting example, sigma-delta controlled fractional-N PLL modulators may be employed in some embodiment of the present disclosure.

In some embodiments, a loop bandwidth of the PLL 102 is smaller than a loop bandwidth of the PLL 104_1 to 104_N. As a non-limiting example, the loop bandwidth of the PLL 102 may be about 300 kHz, and the loop bandwidth of the PLL 104_1 to 104_N may be about 2 MHz.

Figure 2:
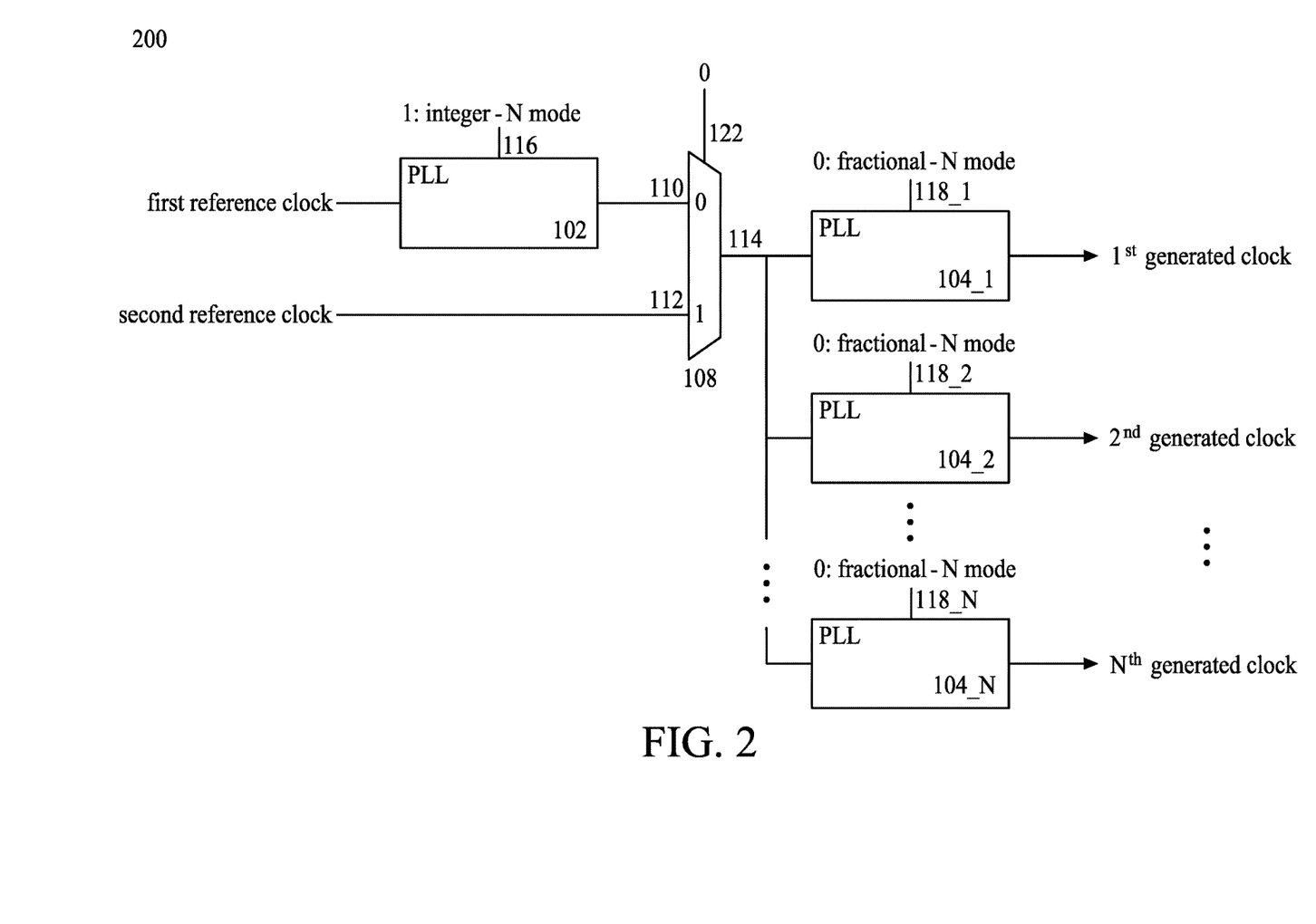
FIG. 2 is a block diagram illustrating a first configuration of the clock generation circuit of FIG. 1 according to some embodiments of the present disclosure.
Figure 3:
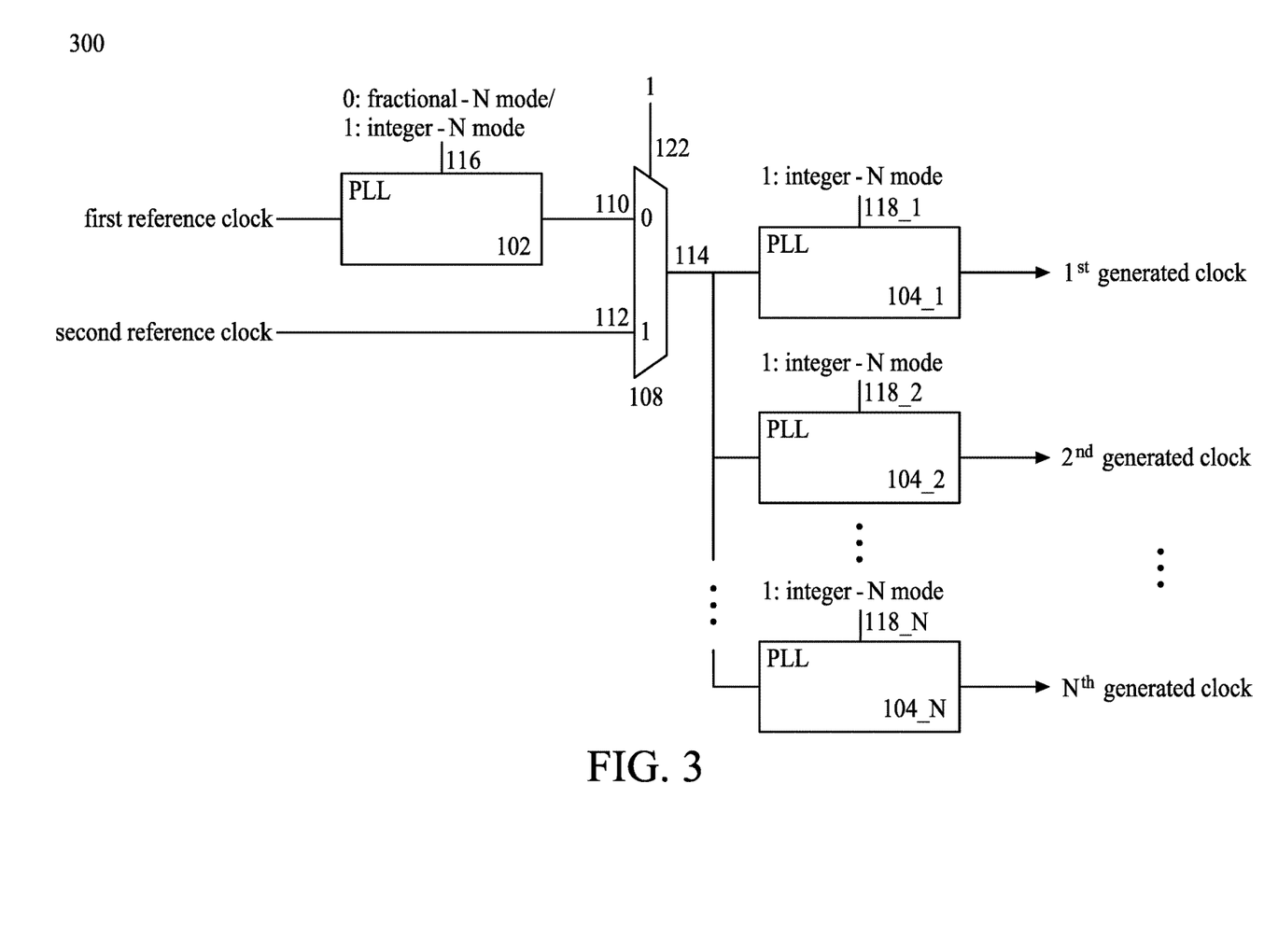
FIG. 3 is a block diagram illustrating a second configuration of the clock generation circuit of FIG. 1 according to some embodiments of the present disclosure.
Figure 4:
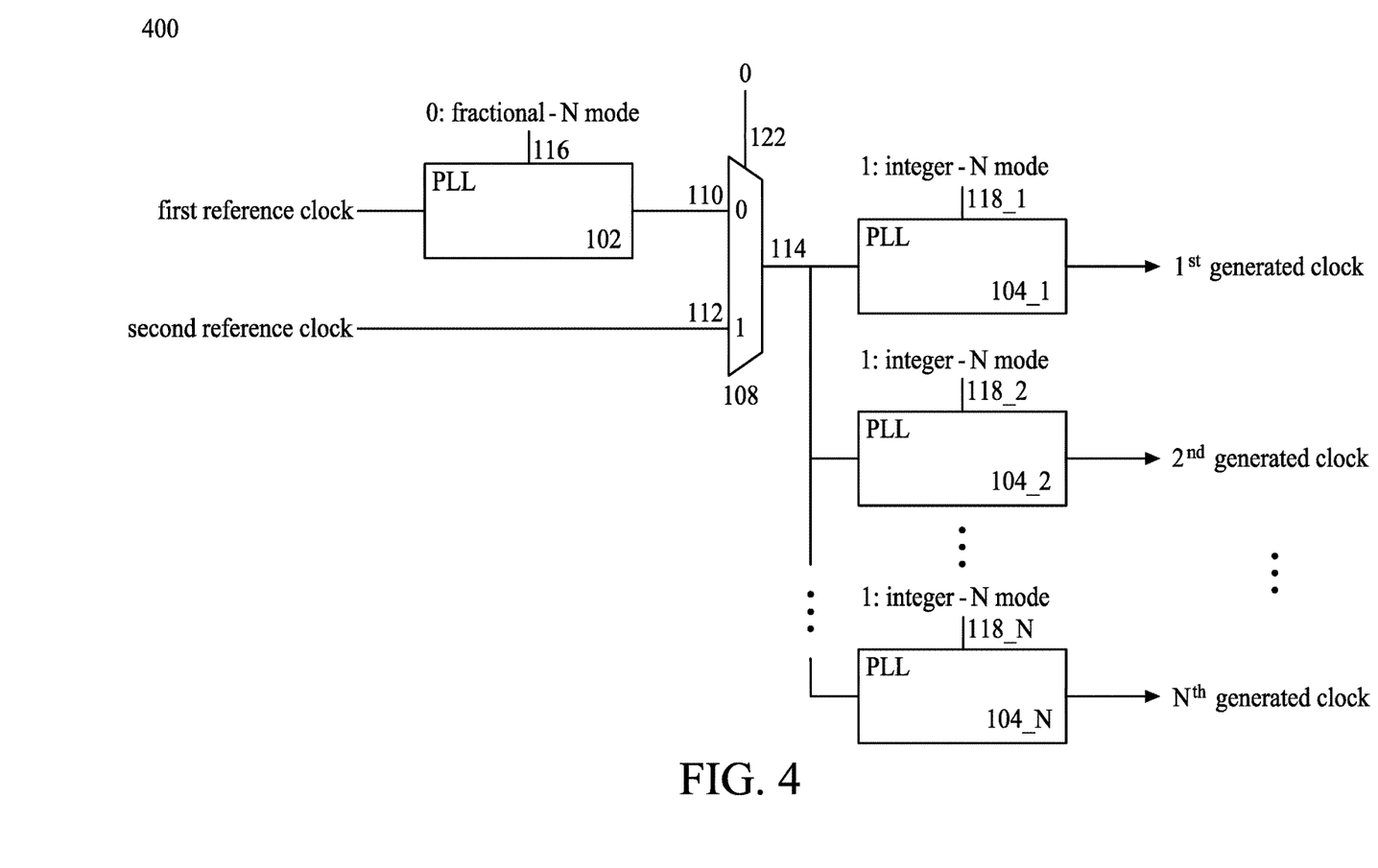
FIG. 4 is a block diagram illustrating a third configuration of the clock generation circuit of FIG. 1 according to some embodiments of the present disclosure.

Through an appropriate configuration implemented in the input control lines 116, 118_1, 118_2, . . . , 118_N, and 122, the clock generation circuit 100 can be applicable to various communication protocols in the field of telecommunication as illustrated in FIG. 2 to FIG. 4. The communication protocols include but are not limited to PCI Express (Peripheral Component Interconnect Express), officially abbreviated as PCIe or PCI-e, which is a high-speed serial computer expansion bus standard, designed to replace the older PCI, PCI-X, and AGP bus standards. In addition, the communication protocols include but are not limited to double data rate (DDR), which transfers data on both the rising and falling edges of the clock signal. Furthermore, the communication protocols include but are not limited to universal serial bus (USB), which is designed to standardize the connection of computer peripherals (including keyboards, pointing devices, digital cameras, printers, portable media players, disk drives and network adapters) to personal computers, both to communicate and to supply electric power.

FIG. 2 is a block diagram illustrating a first configuration of the clock generation circuit 100 of FIG. 1 according to some embodiments of the present disclosure. The first configuration of the clock generation circuit 100 of FIG. 1 is referred to as a clock generation scheme 200. As shown in FIG. 2, the voltage level of the input control line 116 is raised to the high level (for example, the logical value "1") in order to configure the PLL 102 to operate in the integer-N mode; and the voltage level of the input control lines 118_1, 118_2, . . . , and 118_N are all reduced to the low level (for example, the logical value "0") in order to configure the PLLs 104_1, 104_2, . . . , and 104_N to operate in the fractional-N mode. By further reducing the voltage level of the input control line 122 to the low level (for example, the logical value "0"), the PLLs 104_1, 104_2, . . . , and 104_N perform frequency multiplication based on the clock signal output from the PLL 102. The frequency multiple of each of the PLLs 104_1, 104_2, . . . , and 104_N may be different from the others. However, this is not a limitation of the present disclosure. In some embodiments, some of the PLLs 104_1, 104_2, . . . , and 104_N may possess identical frequency multiples, and some of the PLLs 104_1, 104_2, . . . , and 104_N may possess distinct frequency multiples. As a non-limiting example, the clock generation scheme 200 may be applicable to a host such as a personal computer (PC), to which peripheral devices such as flash memory are often connected by a peripheral bus such as PCI Express. In particular, the clock generation scheme 200 may be employed by a PCI Express host-side Physical layer (PHY) circuitry.

FIG. 3 is a block diagram illustrating a second configuration of the clock generation circuit 100 of FIG. 1 according to some embodiments of the present disclosure. The second configuration of the clock generation circuit 100 of FIG. 1 is referred to as a clock generation scheme 300. As shown in FIG. 3, the voltage level of the input control line 122 is raised to the high level (for example, the logical value "1") in order to switch the input line 112 to the single common output line 114. In this way, the second reference clock is therefore fed to each of the PLLs 104_1, 104_2, ..., and 104_N. The voltage level of the input control lines 118_1, 118_2, ..., and 118_N are all raised to the high level (for example, the logical value "1") in order to configure the PLLs 104_1, 104_2, ..., and 104_N to operate in the integer-N mode. In the second configuration, the setting of the control line 116 is independent from the overall operation of the clock generation circuit 100 since the clock signal output from the PLL 102 is not passed to the downstream stage, i.e., the PLLs 104_1, 104_2, ..., and 104_N following the PLL 102. The frequency multiple of each of the PLLs 104_1, 104_2, ..., and 104_N may be different from the others. However, this is not a limitation of the present disclosure. In some embodiments, some of the PLLs 104_1, 104_2, ..., and 104_N may possess identical frequency multiples, and some of the PLLs 104_1, 104_2, ..., and 104_N may possess distinct frequency multiples. To elaborate, the $1^{st}$ generated clock, $2^{nd}$ generated clock, ..., and $N^{th}$ generated clock are derived from the second reference clock generated at the remote side (e.g., the host-side) by another clock generation scheme, and the clock generation scheme 300 may be regarded as a frequency follower. As a non-limiting example, the clock generation scheme 300 may be applicable to a peripheral device connected to a peripheral bus such as PCI Express. In particular, the clock generation scheme 300 may be employed by a PCI Express device-side Physical layer (PHY) circuitry.

FIG. 4 is a block diagram illustrating a third configuration of the clock generation circuit 100 of FIG. 1 according to some embodiments of the present disclosure. The third configuration of the clock generation circuit 100 of FIG. 1 is referred to as a clock generation scheme 400. As shown in FIG. 4, the voltage level of the input control line 116 is reduced to the low level (for example, the logical value "0") in order to configure the PLL 102 to operate in the fractional-N mode; and the voltage level of the input control lines 118_1, 118_2, ..., and 118_N are all raised to the high level (for example, the logical value "1") in order to configure the PLLs 104_1, 104_2, ..., and 104_N to operate in the integer-N mode. By further reducing the voltage level of the input control line 122 to the low level (for example, the logical value "0"), the PLLs 104_1, 104_2, ..., and 104_N therefore perform frequency multiplication based on the clock signal output from the PLL 102. The frequency multiple of each of the PLLs 104_1, 104_2, ..., and 104_N may be different from each other. However, this is not a limitation of the present disclosure. In some embodiments, some of the PLLs 104_1, 104_2, ..., and 104_N may possess identical frequency multiples, and some of the PLLs 104_1, 104_2, ..., and 104_N may possess distinct frequency multiples. As a non-limiting example, the clock generation scheme 400 may be applicable to DDR systems with high data transfer speed requirements, such as microprocessor front side busses, Ultra-3 SCSI, graphics RAM, main memory, the HyperTransport bus, and analog-to-digital converters (ADCs).

Figure 5:
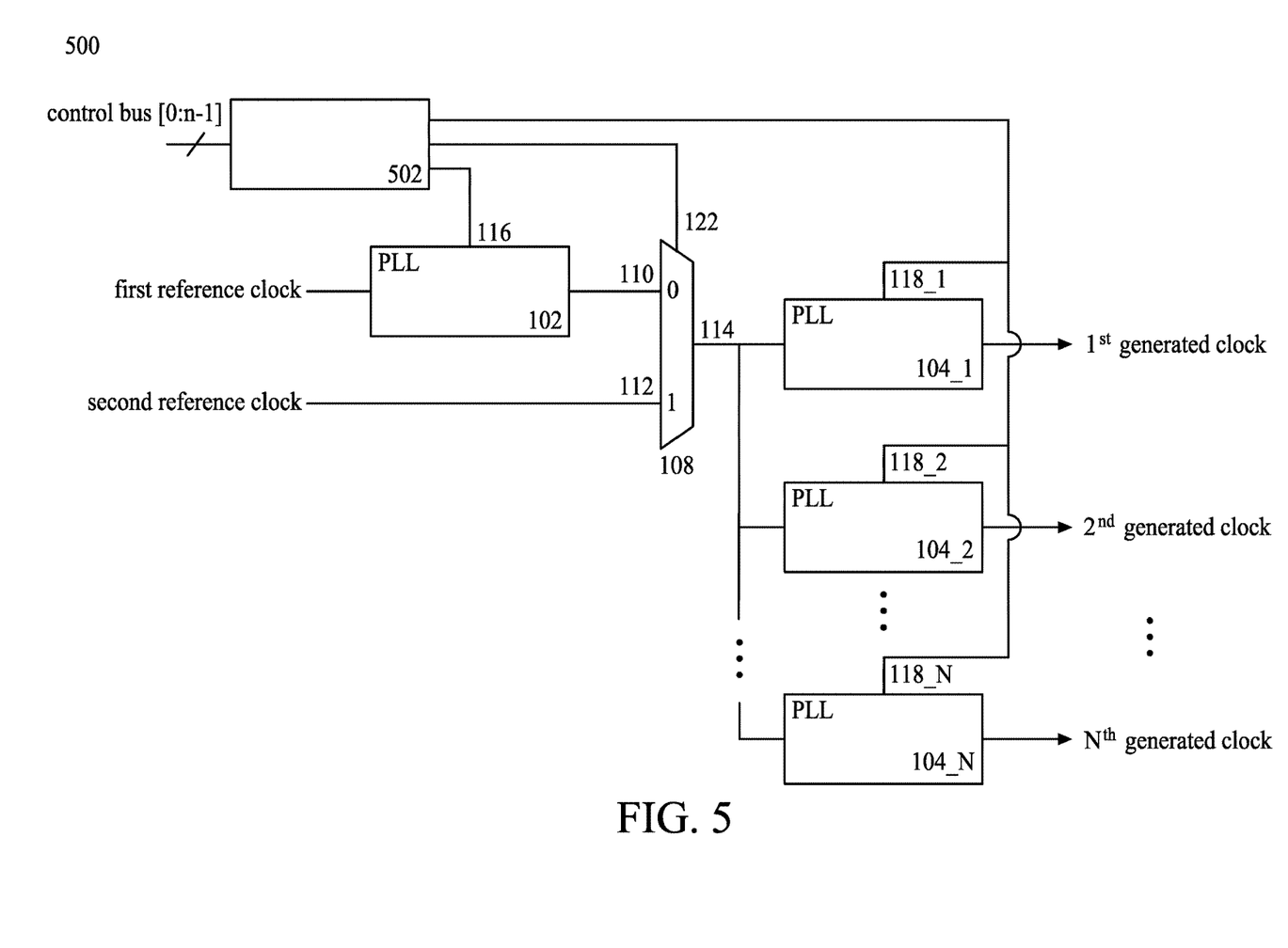
FIG. 5 is a block diagram illustrating a clock generation circuit according to some embodiments of the present disclosure.

The input control lines 116, 122, 118_1, 118_2, ..., and 118_N may be further controlled by an n-bit control bus [0:n-1], where n in the present disclosure is a positive integer value, as shown in FIG. 5. FIG. 5 is a block diagram illustrating a clock generation circuit 500 according to some embodiments of the present disclosure. The clock generation circuit 500 is identical to the clock generation circuit 100, except the clock generation circuit 500 further includes a circuit unit 502. The circuit unit 502 may be implemented by combinational logic circuits, and the circuit unit 502 is used to determine the logical value of the input control lines 116, 122, 118_1, 118_2, ..., and 118_N based on the control bus [0:n-1]. Please note that the input control lines 118_1, 118_2, ..., and 118_N are collectively referred to as 118 hereinafter for conciseness.

In an embodiment, the control bus [0:n-1] includes two-bit control bus [0:1]. When it is desired to configure the clock generation circuit 500 in the first configuration (i.e., the clock generation scheme 200 of FIG. 2), both bits of the control bus [0:1] are reduced to the low level (for example, the logical value "0") in order to configure the input control lines 116, 122 and 118 to logical values "1," "0" and "0," respectively. When it is desired to configure the clock generation circuit 500 in the second configuration (i.e., the clock generation scheme 300 of FIG. 3), the bits of the control bus [0:1] are set to the logical values "0" and "1," respectively, in order to configure the input control lines 122 and 118 to logical values "1" and "1," respectively. Please note that the value of the input control line 116 is inconsequential because the clock signal output from the PLL 102 is not fed to the PLLs 104_1, 104_2, ..., and 104_N, so the value indicating the mode of the input control line 116 does not matter. When it is desired to configure the clock generation circuit 500 in the third configuration (i.e., the clock generation scheme 400 of FIG. 4), the bits of the control bus [0:1] are set to logical values "1" and "0," respectively, in order to configure the input control lines 116, 122 and 118 to logical values "0," "0" and "1," respectively.

Figure 6:
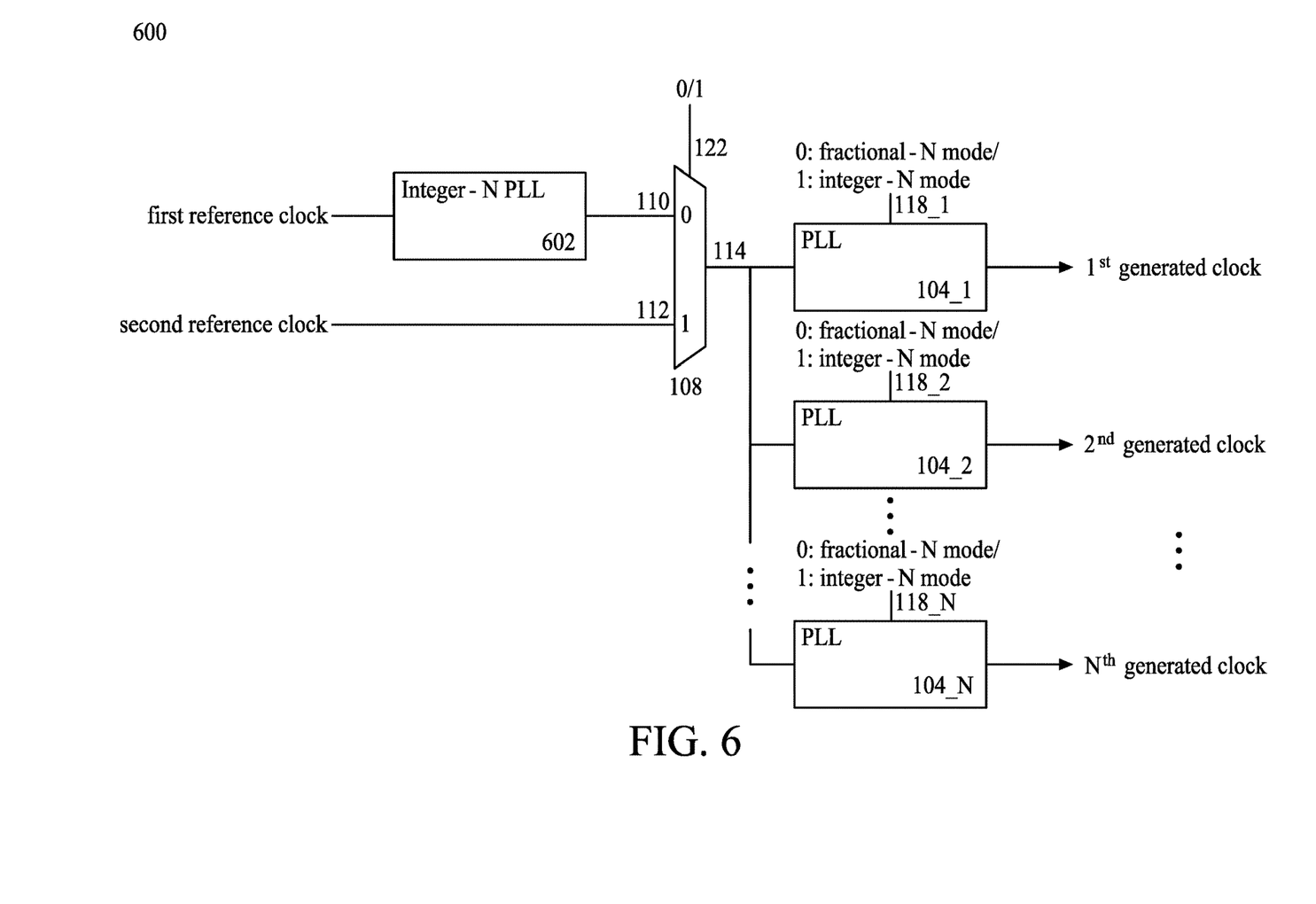
FIG. 6 is a block diagram illustrating a clock generation circuit according to some embodiments of the present disclosure.
Figure 7:
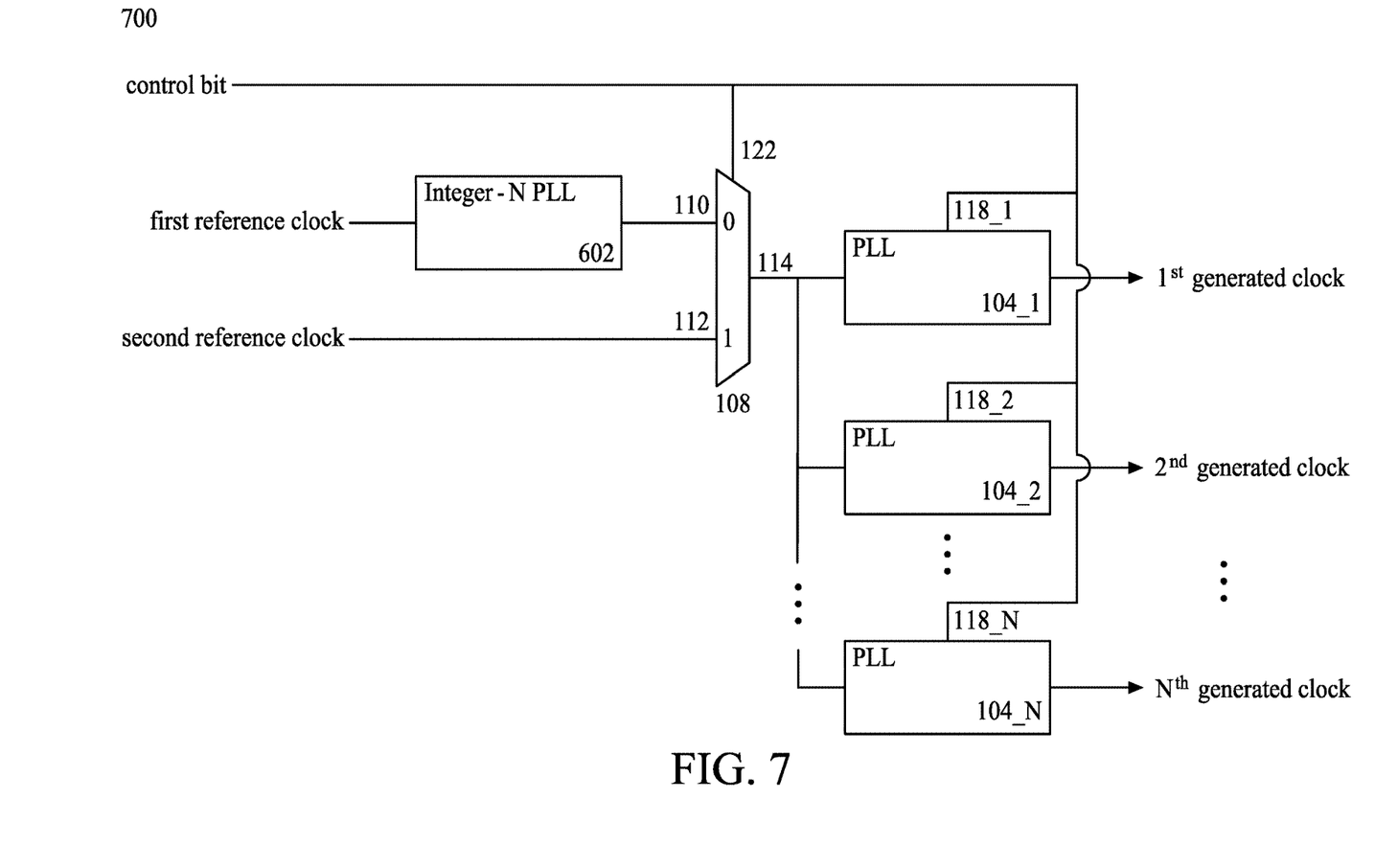
FIG. 7 is a block diagram illustrating a clock generation circuit according to some embodiments of the present disclosure.

The clock generation circuit 100 may be further simplified to include only the configuration of the clock generation schemes 200 and 300, which are applicable to the PCI Express host-side and the PCI Express device-side, respectively. FIG. 6 is a block diagram illustrating a clock generation circuit 600 according to some embodiments of the present disclosure. The clock generation circuit 600 is identical to the clock generation circuit 100, except the PLL 102 is replaced by a PLL 602. Unlike the PLL 102, which possesses the ability to operate in either the integer-N mode or the fractional-N mode, the PLL 602 operates in the integer-N mode constantly. FIG. 7 is a block diagram illustrating a clock generation circuit 700 according to some embodiments of the present disclosure. As shown in FIG. 7, the input control lines 122, 118_1, 118_2, ..., and 118_N are collectively controlled by a control bit. Please note that the input control lines 118_1, 118_2, ..., and 118_N are collectively referred to as 118 hereinafter for conciseness.

When it is desired to configure the clock generation circuit 700 in the first configuration (i.e., the clock generation scheme 200 of FIG. 2), the control bit is reduced to the low level (for example, the logical value "0") in order to configure all the input control lines 122 and 118 to logical value "0." In contrast, when it is desired to configure the clock generation circuit 700 in the second configuration (i.e., the clock generation scheme 300 of FIG. 3), the control bit is set to the logical value "1" in order to configure all the input control lines 122 and 118 to logical value "1."

Figure 8:
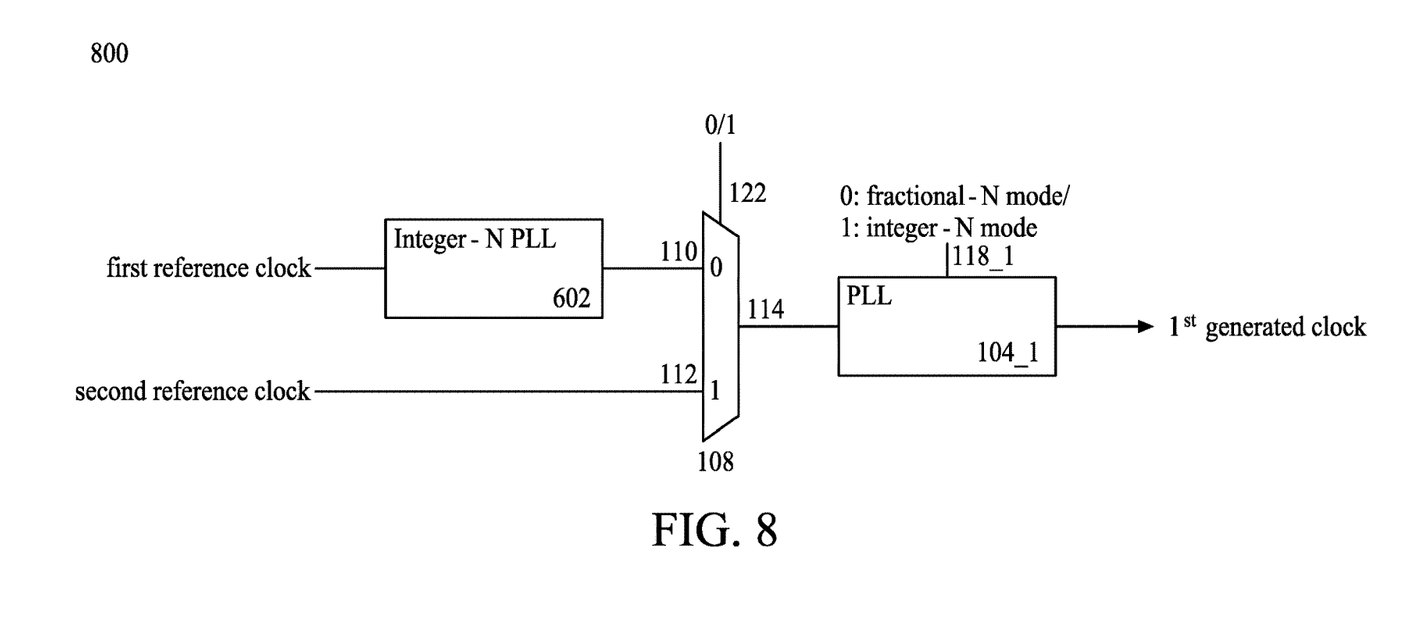
FIG. 8 is a block diagram illustrating a clock generation circuit according to some embodiments of the present disclosure.

FIG. 8 is a block diagram illustrating a clock generation circuit 800 according to some embodiments of the present disclosure. The clock generation circuit 800 is identical to the clock generation circuit 600, except the PLLs 104_2 to 104_N are removed. As a non-limiting example, the clock generation scheme 800 may be applicable to a host such as a personal computer (PC), to which peripheral devices such as flash memory are often connected by a peripheral bus such as USB.

Some embodiments of the present disclosure provide a clock generation circuit arranged in a first system. The clock generation circuit includes: a first dual-mode PLL, arranged for generating a first output clock in an integer-N mode or a fractional-N mode selectively, the first output clock being generated based on a first reference clock; and a second dual-mode PLL, arranged for generating a second output clock in an integer-N mode or a fractional-N mode selectively, the second output clock being generated based on the first output clock or a second reference clock selectively.

Some embodiments of the present disclosure provide a circuitry. The circuitry includes: a clock generation circuit, including: a circuit unit, arranged for generating a first control signal, a second control signal and a third control signal; a first dual-mode PLL, arranged for generating a first output clock based on a first reference clock, the first dual-mode PLL being configured to operate in an integer-N mode or a fractional-N mode according to the first control signal; a 2-to-1 multiplexer, arranged for selectively switching the first output clock or a second reference clock to an output of the 2-to-1 multiplexer according to the second control signal; and a plurality of second dual-mode PLLs, arranged for generating a plurality of second output clocks, respectively, based on the output of the 2-to-1 multiplexer, the plurality of second dual-mode PLLs being configured to operate in an integer-N mode or a fractional-N mode according to the third control signal.

Some embodiments of the present disclosure provide a circuitry. The circuitry includes: a clock generation circuit, including: a single-mode PLL, arranged for generating a first output clock based on a first reference clock in an integer-N mode; a 2-to-1 multiplexer, arranged for selectively switching the first output clock or a second reference clock to an output of the 2-to-1 multiplexer; and a plurality of dual-mode PLLs, arranged for generating a plurality of second output clocks, respectively, based on the output of the 2-to-1 multiplexer, the second dual-mode PLLs being configured to operate in an integer-N mode or a fractional-N mode selectively.

Some embodiments of the present disclosure provide a circuitry. The circuitry includes: a clock generation circuit, including: a single-mode PLL, arranged for generating a first output clock based on a first reference clock in an integer-N mode; a 2-to-1 multiplexer, arranged for selectively switching the first output clock or a second reference clock to an output of the 2-to-1 multiplexer; and a dual-mode PLL, arranged for generating a second output clock based on the output of the 2-to-1 multiplexer, the dual-mode PLL being configured to operate in an integer-N mode or a fractional-N mode selectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clock generation circuit arranged in a first system, the clock generation circuit comprising:
    a first dual-mode PLL, arranged for generating a first output clock in an integer-N mode or a fractional-N mode selectively, the first output clock being generated based on a first reference clock; and
    a 2-to-1 multiplexer, arranged for selecting one of the first output clock and a second reference clock as an output of the 2-to-1 multiplexer according to a first control signal; and
    a second dual-mode PLL, arranged for generating a second output clock in an integer-N mode or a fractional-N mode selectively, wherein the second dual-mode PLL operates in the integer-N mode according to a second control signal generated in response to the first control signal when the second reference clock is selected as the output of the 2-to-1 multiplexer.

2. The clock generation circuit of claim 1, wherein when the clock generation circuit operates in a first configuration, the first dual-mode PLL generates the first output clock in the integer-N mode, the 2-to-1 multiplexer selects the first output clock as the output of the 2-to-1 multiplexer according to the first control signal, and the second dual-mode PLL receives the second control signal to generate the second output clock in the fractional-N mode based on the first output clock.

3. The clock generation circuit of claim 1, wherein when the clock generation circuit operates in a second configuration, the 2-to-1 multiplexer selects the second reference clock as the output of the 2-to-1 multiplexer according to the first control signal.

4. The clock generation circuit of claim 1, wherein when the clock generation circuit operates in a third configuration, the first dual-mode PLL generates the first output clock in the fractional-N mode, the 2-to-1 multiplexer selects the first output clock as the output of the 2-to-1 multiplexer according to the first control signal, and the second dual-mode PLL receives the second control signal to generate the second output clock in the integer -N mode based on the first output clock.

5. The clock generation circuit of claim 1, further comprising a third dual-mode PLL, arranged for generating an output clock in an integer-N mode or a fractional-N mode selectively, the output clock of the third dual-mode PLL being generated based on the first output clock of the first dual-mode PLL or the second reference clock selectively.

6. The clock generation circuit of claim 1, wherein the first reference clock originates from a first electronic oscillator circuit in the first system, and the second reference clock originates from a second electronic oscillator circuit in a second system remote from the first system, and a jitter of the second reference clock is lower than a jitter of the first reference clock.

7. A circuitry, comprising:
    a clock generation circuit, including:
    a circuit unit, arranged for generating a first control signal, a second control signal and a third control signal;
    a first dual-mode PLL, arranged for generating a first output clock based on a first reference clock, the first dual-mode PLL being configured to operate in an integer-N mode or a fractional-N mode according to the first control signal;

a 2-to-1 multiplexer, arranged for selectively switching the first output clock or a second reference clock to an output of the 2-to-1 multiplexer according to the second control signal; and a plurality of second dual-mode PLLs, arranged for generating a plurality of second output clocks respectively based on the output of the 2-to-1 multiplexer, the plurality of second dual-mode PLLs being configured to operate in an integer-N mode or a fractional-N mode, wherein the second dual-mode PLLs operate in the integer-N mode according to the third control signal generated in response to the second control signal when the 2-to-1 multiplexer switches the second reference clock to the output of the 2-to-1 multiplexer.

8. The circuitry of claim 7, wherein when the clock generation circuit operates in a first configuration, the first dual-mode PLL operates in the integer-N mode, the 2-to-1 multiplexer switches the first output clock to the output of the 2-to-1 multiplexer, and the plurality of second dual-mode PLLs operate in the fractional-N mode.

9. The circuitry of claim 7, wherein when the clock generation circuit operates in a second configuration, the 2-to-1 multiplexer switches the second reference clock to the output of the 2-to-1 multiplexer, and the plurality of second dual-mode PLLs operate in the integer-N mode.

10. The circuitry of claim 7, wherein when the clock generation circuit operates in a third configuration, the first dual-mode PLL operates in the fractional-N mode, the 2-to-1 multiplexer switches the first reference clock to the output of the 2-to-1 multiplexer, and the plurality of second dual-mode PLLs operate in the integer-N mode.

11. A circuitry, comprising:
a clock generation circuit, including:
a single-mode PLL, arranged for generating a first output clock based on a first reference clock in an integer-N mode;
a 2-to-1 multiplexer, arranged for selectively switching the first output clock or a second reference clock to an output of the 2-to-1 multiplexer according to a first control signal; and
a plurality of dual-mode PLLs, arranged for generating a plurality of second output clocks respectively based on the output of the 2-to-1 multiplexer, the dual-mode PLLs being configured to operate in an integer-N mode or a fractional-N mode selectively, wherein the dual-mode PLLs operate in the integer-N mode according to a second control signal generated in response to the first control signal when the 2-to-1 multiplexer switches the second reference clock to the output of the 2-to-1 multiplexer.

12. The circuitry of claim 11, wherein when the clock generation circuit operates in a first configuration, the 2-to-1 multiplexer switches the first output clock to the output of the 2-to-1 multiplexer, and the plurality of dual-mode PLLs operate in the fractional-N mode.

13. The circuitry of claim 11, wherein when the clock generation circuit operates in a second configuration, the 2-to-1 multiplexer switches the second reference clock to the output of the 2-to-1 multiplexer, and the plurality of dual-mode PLLs operate in the integer-N mode.

14. A circuitry, comprising:
a clock generation circuit, including:
a single-mode PLL, arranged for generating a first output clock based on a first reference clock in an integer-N mode;
a 2-to-1 multiplexer, arranged for selectively switching the first output clock or a second reference clock to an output of the 2-to-1 multiplexer according to a first control signal; and
a dual-mode PLL, arranged for generating a second output clock based on the output of the 2-to-1 multiplexer, the dual-mode PLL being configured to operate in an integer-N mode or a fractional-N mode selectively, wherein the dual-mode PLL operates in the integer-N mode according to a second control signal generated in response to the first control signal when the 2-to-1 multiplexer switches the second reference clock to the output of the 2-to-1 multiplexer.

15. The circuitry of claim 14, wherein when the clock generation circuit operates in a first configuration, the 2-to-1 multiplexer switches the first output clock to the output of the 2-to-1 multiplexer, and the dual-mode PLL operates in the fractional-N mode.

16. The circuitry of claim 14, wherein when the clock generation circuit operates in a second configuration, the 2-to-1 multiplexer switches the second reference clock to the output of the 2-to-1 multiplexer, and the dual-mode PLL operates in the integer-N mode.

* * * * *